US006869735B2

(12) United States Patent
Tamada

(10) Patent No.: US 6,869,735 B2
(45) Date of Patent: Mar. 22, 2005

(54) METHOD OF PATTERN LAYOUT OF A PHOTOMASK FOR PATTERN TRANSFER

(75) Inventor: Naohisa Tamada, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 121 days.

(21) Appl. No.: 10/338,004

(22) Filed: Jan. 8, 2003

(65) Prior Publication Data

US 2004/0018434 A1 Jan. 29, 2004

(30) Foreign Application Priority Data

Jul. 23, 2002 (JP) ........................................ 2002-214047

(51) Int. Cl.[7] .............................................. G03F 9/00
(52) U.S. Cl. .............................................................. 430/5
(58) Field of Search ........................... 430/5, 296, 311, 430/394

(56) References Cited

U.S. PATENT DOCUMENTS 5,242,770 A      9/1993  Chen et al.
6,074,787 A  *   6/2000  Takeuchi ..................... 430/5
2003/0232253 A1 * 12/2003 Leroux et al. ................. 430/5

FOREIGN PATENT DOCUMENTS

JP          6-236836       8/1994
JP          2001-100390    4/2004

* cited by examiner

Primary Examiner—S. Rosasco
(74) Attorney, Agent, or Firm—Leydig, Voit & Mayer, Ltd.

(57) ABSTRACT

In the layout of a photomask for pattern transfer, main patterns for transferring an image to a photosensitive film are positioned; auxiliary patterns, which do not substantially transfer an image to a photosensitive film are temporarily positioned; an auxiliary pattern is selected so an end partially overlaps an end of the main pattern and makes contact with the main pattern; and adjusting the position of the auxiliary pattern selected so that the end of the auxiliary pattern selected completely overlaps the end of the main pattern. Inspection of the photomask for mask defects is simplified while achieving an increase in resolution of a photomask for pattern transfer.

3 Claims, 9 Drawing Sheets

FIG.9 PRIOR ART
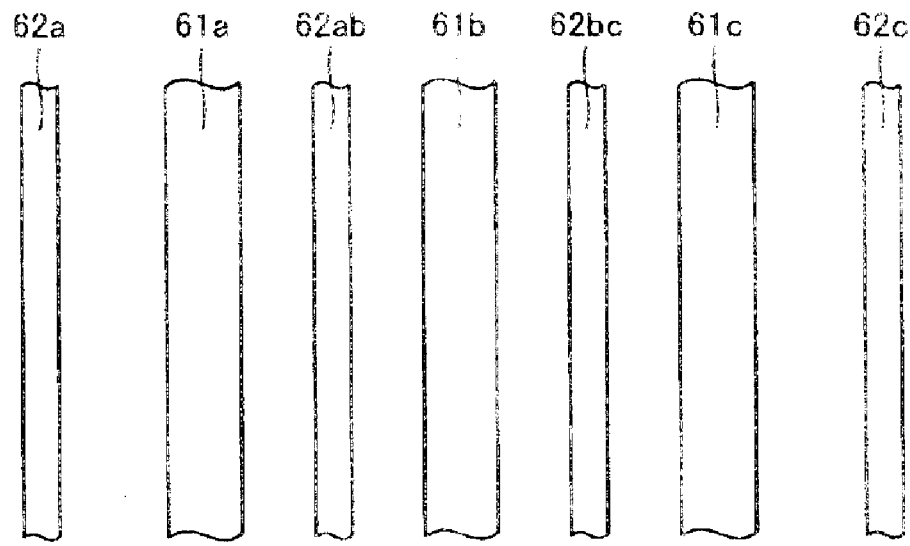
FIG.10A PRIOR ART   FIG.10B PRIOR ART
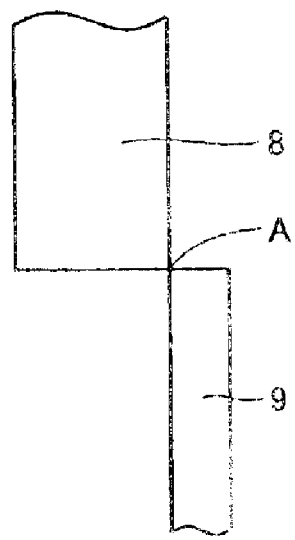 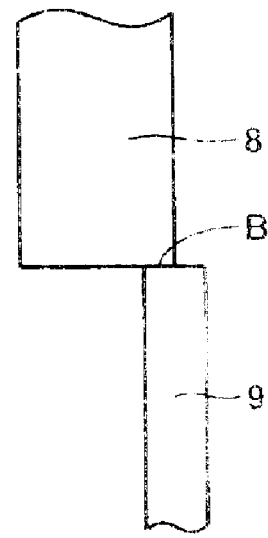

METHOD OF PATTERN LAYOUT OF A PHOTOMASK FOR PATTERN TRANSFER

BACKGROUND OF THE INVENTION

1. Field of the Invention

The present invention relates to a pattern layout method of a photomask for pattern transfer that is used in photolithographic steps of a semiconductor manufacturing process. More specifically, the present invention relates to a pattern layout method of a photomask for pattern transfer having patterns m a belt form for transferring images to a photosensitive film and auxiliary patterns provided for securing a deep depth of focus.

2. Description of the Background Art

In recent years, the integration of semiconductor devices has been significantly increased. Though a variety of steps exist in the manufacturing process for a semiconductor device, it is widely recognized that photolithographic steps, in particular, are the key process steps leading to greater integration of semiconductor devices.

A variety of steps such as steps for forming element isolation regions, steps of forming wires, steps of forming electrodes and steps of forming contacts can be cited as manufacturing steps of a semiconductor device to which photolithographic technology is applied. As described above, an increase in the resolution in the photolithographic steps is essential for greater integration of semiconductor devices.

The photolithographic steps are the steps of transferring a light blocking pattern of a photomask to a photosensitive film, which has been applied to a semiconductor substrate, by irradiating the photosensitive film with light via the photomask. FIG. 6 is a conceptual diagram of a stepper utilized when the photolithographic steps are carried out. Light emitted from light source 1 passes through a fly-eye lens 2 and is condensed by a condenser lens 3 so that a photomask 4 for pattern transfer is irradiated with the light. The light that has been transmitted through a light transmitting portion of photomask 4 for pattern transfer passes through a projection lens 5 so that a photosensitive film 7, which is the material to be treated, on a semiconductor substrate 6 is irradiated with the light and the pattern in photomask 4 is scaled down and transferred to photosensitive film 7. As for the utilized light, an excimer laser beam or the like, in addition to a g-line beam and an line beam, are appropriately used.

Super resolution technology is one from among technologies that have been attracting attention as technologies capable of increasing the resolution of patterns in photolithographic steps. This technology is a technology for resolving patterns not conventionally resolvable that applies a variety of new ideas to respective portions of the optical system.

There exists a technology wherein a pattern (hereinafter referred to as auxiliary pattern) that does not substantially transfer an image to the photosensitive film is placed in the vicinity of a pattern (hereinafter referred to as main pattern) that transfers an image to the photosensitive film-as one type of the above described super resolution technology. Here, this auxiliary pattern is a microscopic pattern no larger than the resolution limit.

This technology controls the phase and intensity of light through the placement of the auxiliary pattern in the vicinity of the main pattern and improves the resolution of patterning in the photolithographic steps by improving the light intensity distribution for the main pattern at the time of exposure. Thereby, it becomes possible to transfer the objective pattern to the photosensitive film formed on the semiconductor substrate with a greater precision and, therefore, it becomes possible to form a semiconductor device provided with a microscopic structure according to the original design. In addition, it becomes possible to make the depth of focus deeper in the photolithographic steps by providing the auxiliary pattern and, thereby, it becomes possible to expand the range of the focal point in order to allow the resolution of the pattern even in the case that a shift in focal point has arisen.

Conventionally, the design of the main pattern has been carried out using CAD (Computer Aided Design). The layout of the auxiliary pattern is automatically arranged according to predetermined rules with respect to this layout of the main pattern.

As shown in FIG. 7, a main pattern 41a extending in a band form, located independently of other main patterns, has, for example, auxiliary patterns 42a on both sides so that auxiliary patterns 42a extend in parallel at a predetermined distance away from main pattern 41a.

On the other hand, main patterns, making up a plurality, placed approximately parallel to each other in an array have auxiliary patterns, as shown in FIGS. 8 and 9, placed according to the pitch of these main patterns. That is to say, in a fine pitch layout wherein main patterns 51a to 51e are arranged in close formation, as shown in FIG. 8, auxiliary patterns 52a and 52e are provided solely outside of main patterns 51a and 51e, which are located on each end, while no auxiliary patterns are provided between main patterns 51a to 51e. This is because patterns are formed with a sufficient precision even in the case that auxiliary patterns are not provided.

In addition, in a middle pitch layout, as shown in FIG. 9, one auxiliary pattern 62ab, 62bc is placed between each pair, respectively, of main patterns 61a to 61c, in addition to auxiliary patterns 62a and 62c placed outside of main patterns 61a and 61c located on each end.

As described above, these auxiliary patterns are automatically placed according to predetermined rules with respect to main patterns. Therefore, in some cases patterns in forms as shown in FIG. 10A and FIG. 10B are formed in a photomask.

FIG. 10A shows the condition wherein a corner formed from the sides that form an end portion of pattern 9 makes contact with corner formed from the sides that form an end portion of pattern 8. In the following, this point of contact A is referred to as a "microscopic point of contact."

In addition, FIG. 10B shows the condition wherein a side that forms an end portion of pattern 9 makes contact with a side that forms an end portion of pattern 8 so that the sides are partially overlapped. In the following, this contacting portion B is referred to as a "microscopic step".

In the present invention, partially overlapped indicates a condition wherein a side of one pattern is partially included in a side of another pattern even though the side of the one pattern is not completely included in the side of the other pattern so that the concept of partial overlapping includes the conditions of FIG. 10A and FIG. 10B.

As cases in which such a microscopic point of contact or a microscopic step is generated, cases such as are shown in FIG. 11 and FIG. 12, for example, are possible. FIG. 11 shows a case of a layout wherein one main pattern 111b, from among two main patterns 111a and 111b in band forms placed parallel to each other in a fine pitch layout, is terminated partway. In this case, an auxiliary pattern is not formed between main pattern 111a and main pattern 111b. However, in a portion wherein main pattern 111b is terminated partway (portion not extending in a parallel manner), an auxiliary pattern 112a is placed at a position at a distance d1 from main pattern 111a so that auxiliary pattern 112a extends parallel to main pattern 111a in an independent pitch layout. At this time, as shown in the figure, auxiliary pattern 112a and main pattern 111b make, in some cases, contact with each other so that a microscopic point of contact or a microscopic step is generated.

In addition, FIG. 12 shows a case of a layout wherein one main pattern 121b, from among the two main belt-shaped patterns 121a and 121b arranged in parallel in a middle pitch layout, is terminated partway. In this case, an auxiliary pattern 122ab is placed between main pattern 121a and main pattern 121b at a position at a distance d3 from the respective main patterns. This auxiliary pattern 122ab is also terminated partway according to main pattern 121b. In addition, in a portion wherein main pattern 121b is terminated partway (portion not extending in a parallel manner), an auxiliary pattern 122a is placed at a position at a distance d2 from main pattern 121a in an independent pitch layout. Accordingly, as shown in the figure, in some cases this auxiliary pattern 122a and auxiliary pattern 122ab that is terminated partway make contact with each other so that a microscopic point of contact or a microscopic step generates.

A photomask for pattern transfer having such a microscopic point of contact or microscopic step causes a problem at the time of inspection for mask defects. Inspection for mask defects is an inspection to confirm whether or not patterns having the form as designed are formed in a photomask. At this time, in the case that there is a microscopic point of contact or a microscopic step in the photomask, as described above, it becomes difficult to determine whether such a microscopic point of contact or microscopic step has been formed according to original intentions or has generated as a defect at the time of mask manufacture. Usually, such an, inspection for mask defects is carried out using a device that automatically, performs inspection for defects based on a predetermined algorithm and, in such a case, the above described problem becomes significant so that the step of inspection for mask defects becomes considerably complicated.

Therefore, according to a prior art, as shown in FIGS. 13 and 14, a portion of auxiliary patterns forming a microscopic point of contact or microscopic step is removed in advance at the design stage of the mask pattern and ease of inspection for mask defects is taken into consideration. Concretely, in the case that an end side of auxiliary pattern 112a partially overlaps the end side of main pattern 111b, as shown in FIG. 11, end portion 112a3 of auxiliary pattern 112a is removed in advance, as shown in FIG. 13. In addition, in the case that an end side of auxiliary pattern 122a partially overlaps an end side of auxiliary pattern 122ab, as shown in FIG. 12, end portion 122a3 of auxiliary pattern 122a and end portion 122ab3 of auxiliary pattern 122ab are removed in advance. Thereby, a microscopic point of contact or a microscopic step can be prevented from being the cause of problems at the time of the inspection for mask defects and, therefore, inspection for mask defects can be made easy to carry out.

However, in the case that a portion of an auxiliary pattern is removed as described above, the resolution of the photosensitive mask due to the main pattern in the vicinity where a portion has been removed becomes insufficient causing the problem wherein the desired form cannot be obtained. In addition, in the worst case, a problem has arisen wherein no pattern is formed in this portion.

In addition, another problem arises wherein a gate pattern makes contact with an active region in the surface of the semiconductor substrate through the placement of an auxiliary pattern in the photomask for pattern transfer in the step of exposure that is carried out in the process of gate pattern formation. This is a problem that arises in the case that auxiliary patterns are automatically positioned according to predetermined rules based on the layout of main patterns.

This problem will be described in detail with reference to FIGS. 15A and 15B. In the case that an end side of auxiliary pattern 132a completely overlaps an end side of main pattern 131b, as shown in FIG. 15A, when transfer of patterns is implemented without the carrying out of any treatments on this auxiliary pattern 132a, a protrusion 134 may be generated at an end portion of gate pattern 133b made of a conductive layer, as shown in FIG. 15B. This is because the end side of main pattern 131b makes contact with the end side of auxiliary pattern 132a in the photomask so that the end portion of this auxiliary pattern 132a transfers the image. The generation of this unexpected protrusion allows gate pattern 133b to reach to a position above active region 201 so as to, in some cases, significantly affect the device characteristics.

SUMMARY OF THE INVENTION

An object of the present invention is to provide a pattern layout method of a photomask for pattern transfer wherein inspection for mask defects can easily be carried out while achieving an increase in resolution by providing auxiliary patterns.

A pattern layout method of a photomask for pattern transfer according to a first aspect of the present invention is a pattern layout method of a photomask for pattern transfer used in a manufacturing process for a semiconductor device for transferring an image to a photosensitive film and is provided with the following steps:

(a) the step of positioning belt-formed patterns for transferring an image to a photosensitive film;

(b) the step of temporarily positioning auxiliary patterns that do not substantially transfer an image to the photosensitive film according to predetermined rules based on the layout of belt-formed patterns;

(c) the step of selecting an auxiliary pattern wherein an end side forming an end thereof partially overlap an end side forming an end of a belt-formed pattern so as to make contact from among the auxiliary patterns; and (d) the step of adjusting the position of the selected auxiliary pattern so that the end side of the selected auxiliary pattern completely overlaps the end side of the belt-formed pattern so as to make contact.

A pattern layout method of a photomask for pattern transfer according to the second aspect of the present invention is a pattern layout method of a photomask for pattern transfer used in a manufacturing process for a semiconductor device for transferring an image to a photosensitive film and is provided with the following steps:

(a) the step of positioning belt-formed patterns for transferring an image to a photosensitive film;

(b) the step of temporarily positioning auxiliary patterns that do not substantially transfer an image to the photosensitive film according to predetermined rules based on the layout of belt-formed patterns;

(c) the step of selecting an auxiliary pattern wherein an end side-forming an end thereof partially overlaps an end side forming an end of another auxiliary pattern so as to make contact from among the auxiliary patterns; and (d) the step of adjusting the position of the selected auxiliary pattern so that the end side of the other auxiliary pattern completely overlaps the end side of the selected auxiliary pattern so as to make contact.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a pattern diagram showing auxiliary patterns positioned near main belt-shaped patterns having an intermediate pitch;

FIG. 10A is a pattern diagram for describing a microscopic point of contact;

FIG. 10B is a pattern diagram for describing a microscopic step;

DESCRIPTION OF THE PREFERRED EMBODIMENTS

In the following, embodiments of the present invention will be described with reference to the drawings.

First Embodiment

Figure 1:
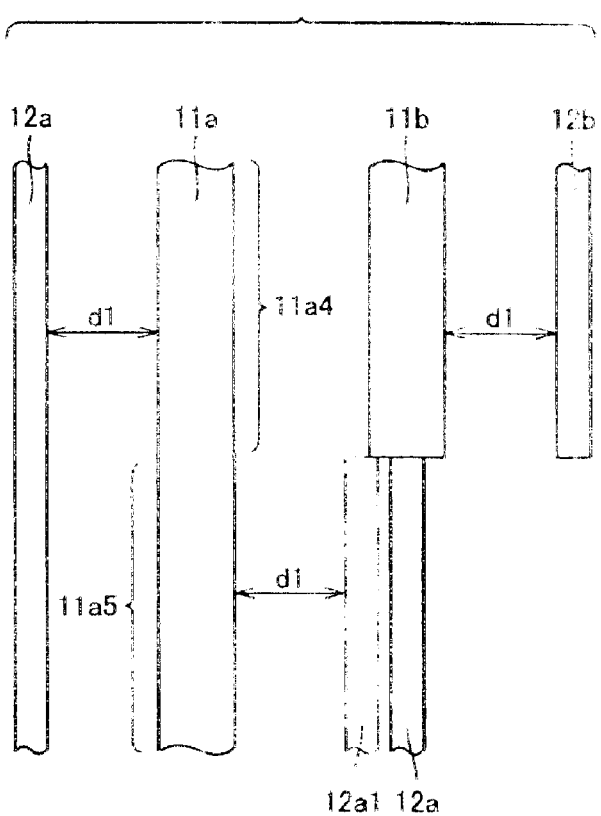
FIG. 1 is a pattern diagram for describing a pattern layout method of a photomask for pattern transfer according to a first embodiment of the present invention.
Figure 2:
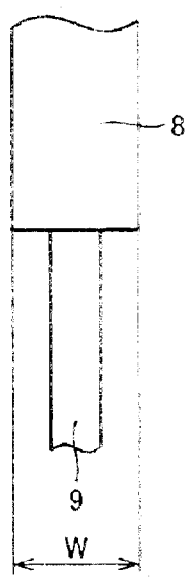
FIG. 2 is a pattern diagram showing the form of a pattern after adjustment for preventing the generation of microscopic points of contact and microscopic steps.
Figure 11:
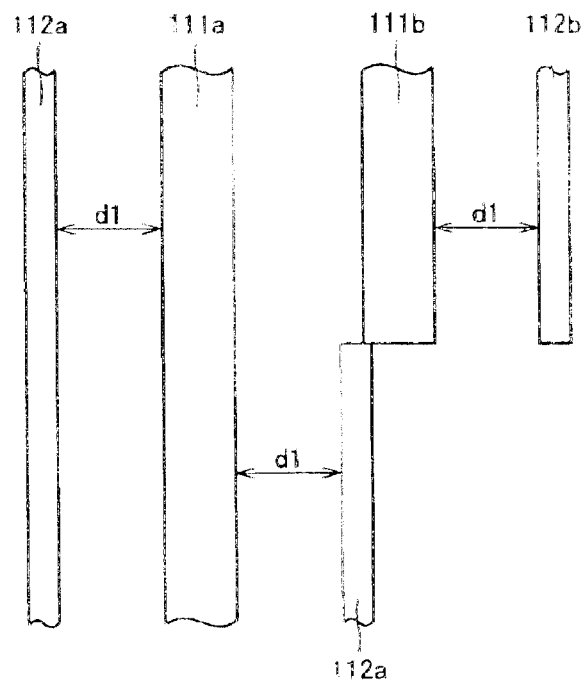
FIG. 11 is a pattern diagram showing an example of a pattern layout that causes microscopic points of contact or microscopic steps.

FIG. 1 is a diagram showing a layout corresponding to the layout of main patterns of FIG. 11 described according to a prior art and shows a case of a layout wherein one main pattern 11b, from among two main patterns 11a and 11b positioned parallel to each other according to a fine pitch layout, is terminated partway.

As shown in FIG. 1, main pattern 11b in a belt form is positioned so as to extend parallel to main pattern 11a in a belt form. Main pattern 11b is shorter than main pattern 11a and-is terminated partway. Therefore, main pattern 11a has a parallel portion 11a4 extending parallel to adjacent main pattern 11b and non-parallel portion 11a5, which does not have an adjacent main pattern 11b.

Auxiliary patterns are temporarily positioned in an automatic manner according to predetermined rules based on the above described layout of the main patterns. In the above described layout of the main patterns, two main patterns 11a and 11b are positioned in the fine pitch layout and, therefore, an auxiliary pattern is not placed between these two main patterns. On the other hand, according to the rules for an isolated pitch layout, auxiliary patterns 12a and 12b are positioned at a distance d1 away from each other outside of main patterns 11a and 11b. In addition, auxiliary pattern 12a1 is temporarily positioned at a distance d1 away from non-parallel portion 11a5 of main pattern 11a on the main pattern 11b side according to the rules for an isolated pitch layout.

Next, auxiliary patterns wherein a microscopic point of contact or a microscopic step has generated are selected. An end side of the above described auxiliary pattern 12a1 partially overlaps an end side of main pattern 11b so as to make contact and, therefore, the auxiliary pattern corresponds to an auxiliary pattern wherein a microscopic point of contact or a microscopic step has generated.

Subsequently, the position of auxiliary pattern 12a1 is adjusted so that the end side of auxiliary pattern 12a1 completely overlaps an end side of main pattern 11b so as to make contact. Thereby, auxiliary pattern, 12a1 is positioned at a location shown by the solid lines in FIG. 1.

Here, the term "completely overlapping" according to the present invention indicates the condition wherein an end side forming an end portion of pattern 9 is completely contained in an end side forming an end portion of pattern 8, having a width that is broader than pattern 9. In addition, the term "adjusting the position so as to completely overlap" indicates that the position of pattern 9 is adjusted so as to achieve the condition wherein pattern 9 is positioned to completely overlap the extended line of the width W of pattern 8.

It is as follows that a characteristic structure of a photomask for pattern transfer formed according to this layout method is summarized. A photomask for pattern transfer is used in a manufacturing process for a semiconductor device and has first and second-belt-formed patterns for transferring an image to a photosensitive film and auxiliary patterns positioned according to predetermined rules relative to the first and second belt-formed patterns, which do not substantially transfer an image. The first and second belt-formed patterns extend in the same direction. The first belt-formed pattern includes a parallel portion that extends in parallel to the adjacent second belt-formed pattern and a non-parallel portion for which there is no adjacent portion of a second belt-formed pattern. An end side forming an end of an auxiliary pattern positioned relative to the non-parallel portion of the first belt-formed pattern completely overlaps an end side forming an end of the second belt-formed pattern so as to make contact.

Layout of auxiliary patterns of a photomask for pattern transfer is carried out based on the above described layout method of patterns and, thereby, it becomes possible to form a photomask that does not cause a microscopic point of contact or a microscopic step and a high resolution can be implemented. By using a photomask for pattern transfer formed according to this layout method, problems such as the generation of incomplete resolution of patterns or the absence of pattern formation can be prevented so that it becomes possible to manufacture a semiconductor device having a microscopic structure that accords with the original design.

Second Embodiment

Figure 3:
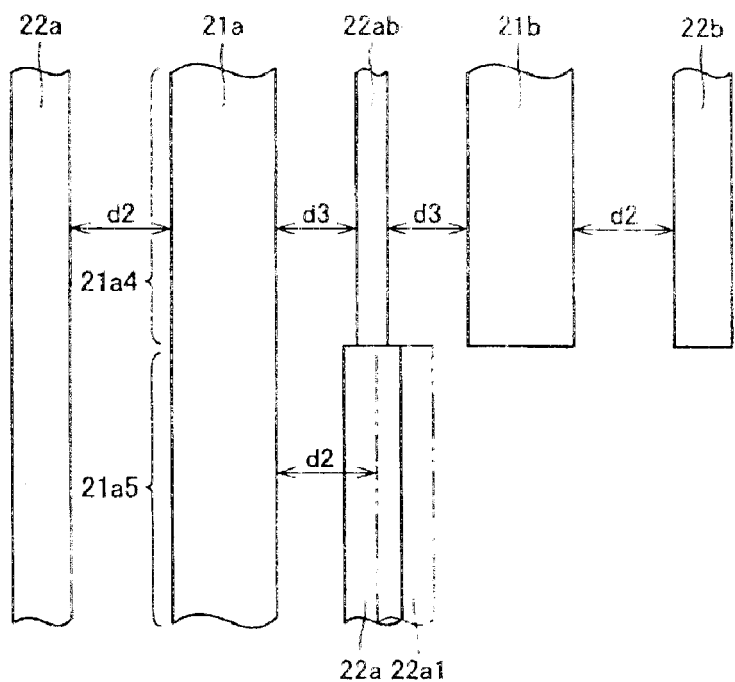
FIG. 3 is a pattern diagram for describing a pattern layout method of a photomask for pattern transfer according to a second embodiment of the present invention.
Figure 4:
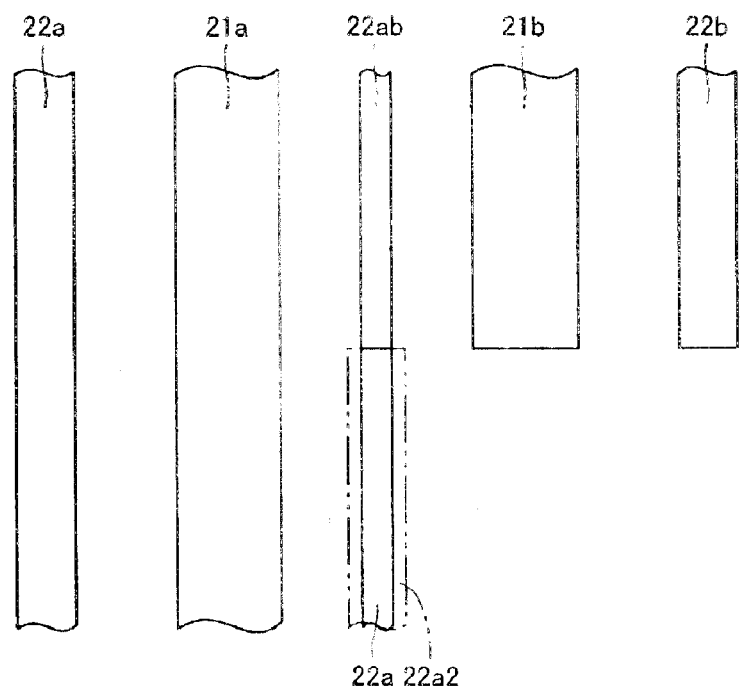
FIG. 4 is a pattern diagram for further describing a pattern layout method of a photomask for pattern transfer according to the second embodiment of the present invention.
Figure 12:
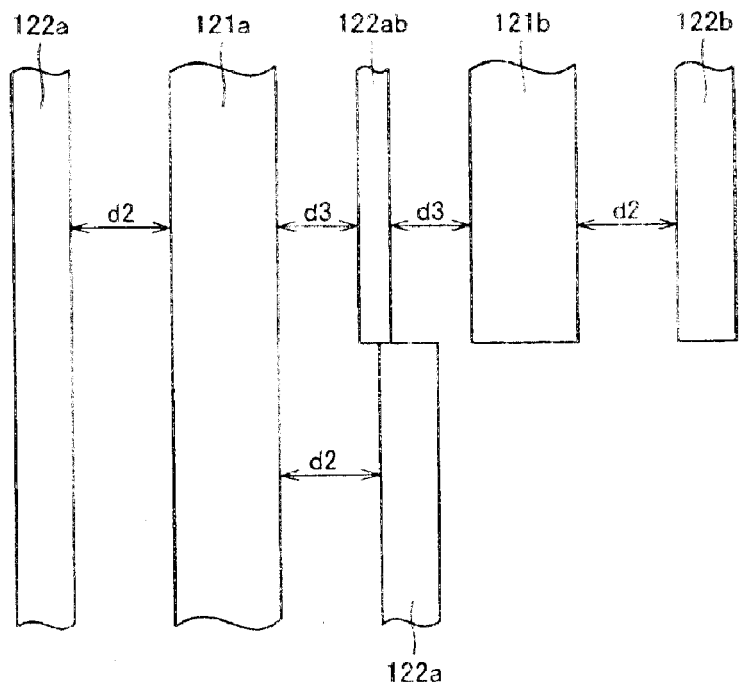
FIG. 12 is a pattern diagram showing another example of a pattern layout that causes microscopic points of contact or microscopic steps.
Figure 13:
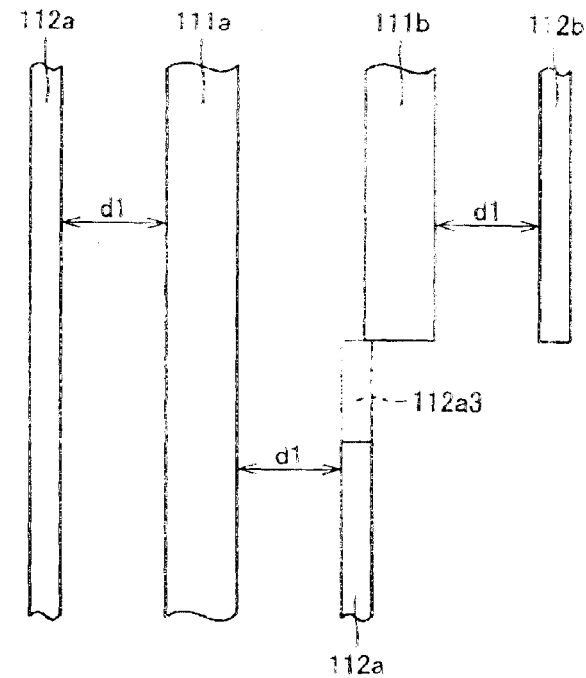
FIG. 13 is a pattern diagram showing a method of correction applied to the layout of FIG. 11, according to a prior art.
Figure 14:
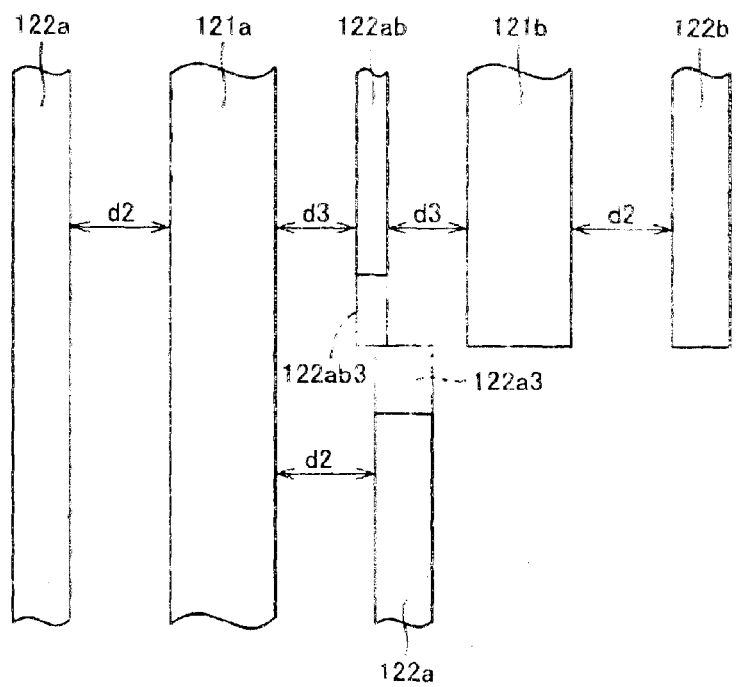
FIG. 14 is a pattern diagram showing a method of correction applied to the layout of FIG. 12, according to a prior art.
Figure 15A:
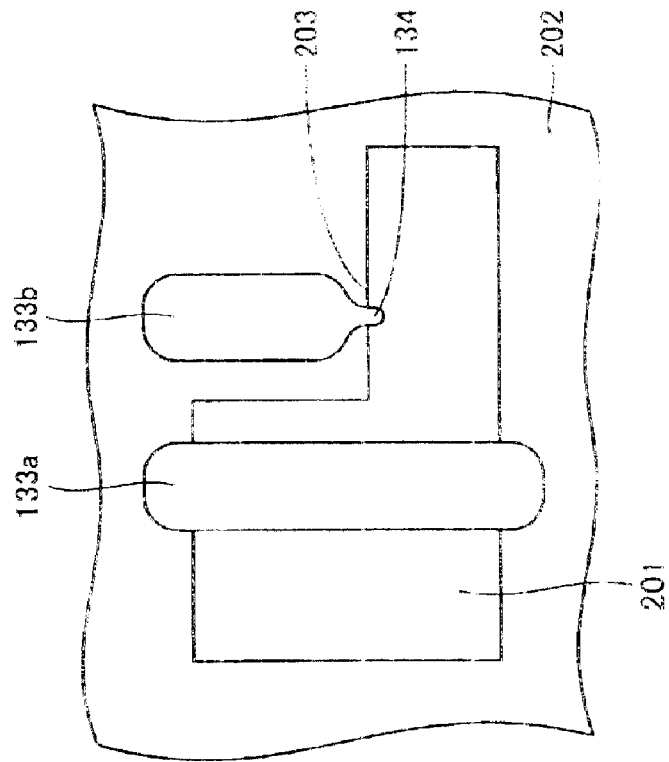
FIG. 15A is a pattern diagram of a photomask for pattern transfer used in a process of forming a gate pattern based on a prior art.
Figure 15B:
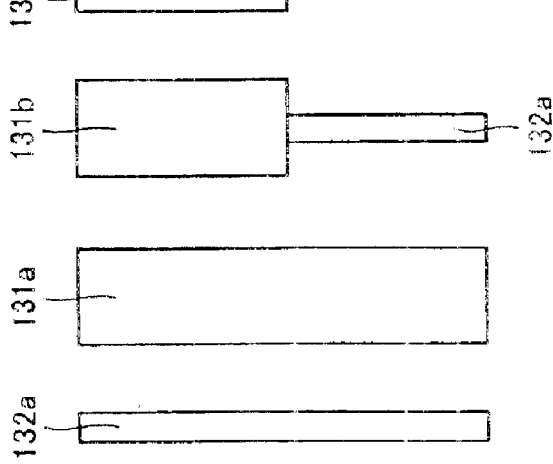
FIG. 15B is a top view of a semiconductor substrate showing the form of a gate pattern formed using a photomask for pattern transfer according to FIG. 15A.

FIGS. 3 and 4 are diagrams showing layouts corresponding to the layout of main patterns of FIG. 12 described in the prior art and show a case wherein one main pattern 21b, from among two main patterns 21a and 21b positioned parallel to each other according to an intermediate pitch layout, is terminated partway.

As shown in FIG. 3, main pattern 21b in a belt form is positioned so as to extend parallel to main pattern 21a in a belt form. Main pattern 21b is shorter than main pattern 21a and is terminated partway. Therefore, main pattern 21a has a parallel portion 21a4 extending parallel to adjacent main pattern 21b and non-parallel portion 21a5, which does not have an adjacent main pattern 21b.

Auxiliary patterns are temporarily positioned in an automatic manner according to predetermined rules based on the above described layout of the main patterns. In the above described layout of the main patterns, two main patterns 21a and 21b are positioned in an intermediate pitch layout and, therefore, an auxiliary pattern 22ab is placed between these two main patterns at a distance d3 away from main patterns 21a and 21b, respectively. This auxiliary pattern 22ab is terminated partway so as to correspond to main pattern 21b. On the other hand, auxiliary patterns 22a and 22b are positioned at a distance d2 away from each other outside of main patterns 21a and 21b. In addition, auxiliary pattern 22al is temporarily positioned at a distance d2 away from non-parallel portion 21a5 of main pattern 21a on the main pattern 21b side according to the rules for an isolated pitch layout.

Next, auxiliary patterns wherein a microscopic point of contact or a microscopic step has generated are selected. An end side of the above described auxiliary pattern 22a1 partially overlaps an end side of another auxiliary pattern 22ab so as to make contact and, therefore, the auxiliary pattern corresponds to an auxiliary pattern wherein a microscopic point of contact or a microscopic step has generated.

Subsequently, the position of auxiliary pattern 22al is adjusted so that the end side of auxiliary pattern 22a1 completely overlaps an end side of another auxiliary pattern 22ab so as to make, contact. Thereby, auxiliary pattern 22al is positioned at a location shown by the solid lines in FIG. 3.

It is as follows that a characteristic structure of a photomask for pattern transfer formed according to this layout method is summarized. A photomask for pattern transfer is used in a manufacturing process for a semiconductor device and has first and second belt-formed patterns for transferring an image to a photosensitive film and auxiliary patterns positioned according to predetermined rules relative to the first and second belt-formed patterns, which do not substantially transfer an image. The first and second belt-formed patterns extend in the same direction. The first belt-formed pattern includes a parallel portion that extends in parallel to the adjacent second belt-formed pattern and a non-parallel portion for which there is no adjacent portion of a second belt-formed pattern. An end side forming an end of an auxiliary pattern positioned relative to the parallel portion of the first belt-formed pattern completely overlaps an end side forming an end of the auxiliary pattern positioned relative to the non-parallel portion of the first belt-formed pattern so as to make contact.

Layout of auxiliary patterns of a photomask for pattern transfer is carried out based on the above described layout method of patterns and, thereby, it becomes possible to form a photomask that does not cause a microscopic point of contact or a microscopic step and a high resolution can be implemented. By using a photomask for pattern transfer formed according to this layout method, problems such as the generation of incomplete resolution of patterns or the absence of pattern creation can be prevented so that it becomes possible to manufacture a semiconductor device having a microscopic structure that accords with the original design.

In addition, in the present embodiment, it is desirable to further adjust the width of the auxiliary pattern, of which the position has been adjusted. As shown in FIG. 4, the width of auxiliary pattern 22a2, of which the position has been adjusted, is adjusted so as to be the same as the width of another auxiliary pattern, auxiliary pattern 22ab. Thereby, auxiliary patterns in the form shown by solid lines in FIG. 4 are obtained.

It is as follows that a characteristic structure of a photomask for pattern transfer formed according to this layout method is summarized. A photomask for pattern transfer is used in a manufacturing process for a semiconductor device and has first and second belt-formed patterns for transferring an image to a photosensitive film and auxiliary patterns positioned according to predetermined rules relative to the first and second belt-formed patterns, which do not substantially transfer an image. The first and second belt-formed patterns extend in the same direction. The first belt-formed pattern includes a parallel portion that extends in parallel to the adjacent second belt-formed pattern and a non-parallel portion for which there is no adjacent portion of a second belt-formed pattern. An end side forming an end of an auxiliary pattern positioned relative to the parallel portion of the first belt-formed pattern completely overlaps an end side forming an end of the auxiliary pattern positioned relative to the non-parallel portion of the first belt-formed pattern so as to make contact. The width of the auxiliary pattern positioned relative to the non-parallel portion of the first pattern in a belt form is the same as the width of the auxiliary pattern positioned relative to the parallel portion of the first pattern in a belt form.

The width of auxiliary patterns of which the positions have been adjusted is further adjusted in the above manner, thereby the auxiliary pattern passing between two main patterns becomes one continuous auxiliary pattern having a uniform width and, therefore, it becomes possible to more easily carry out inspection for mask defects.

Third Embodiment

The present embodiment prevents a gate pattern from making contact with an active region.

Figure 5A:
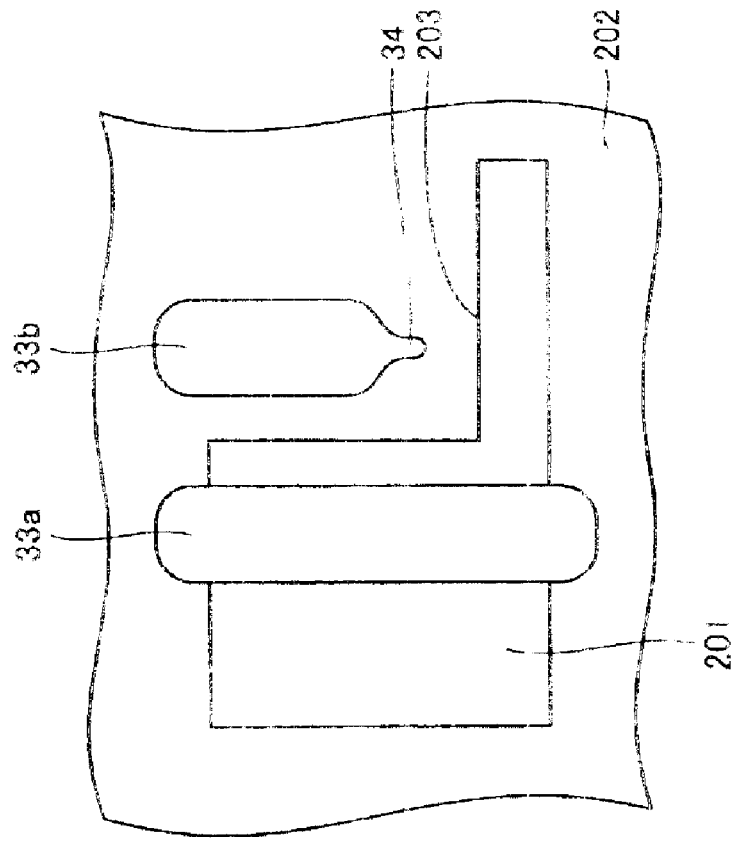
FIG. 5A is a pattern diagram of a photomask for pattern transfer based on a third embodiment of the present invention.
Figure 5B:
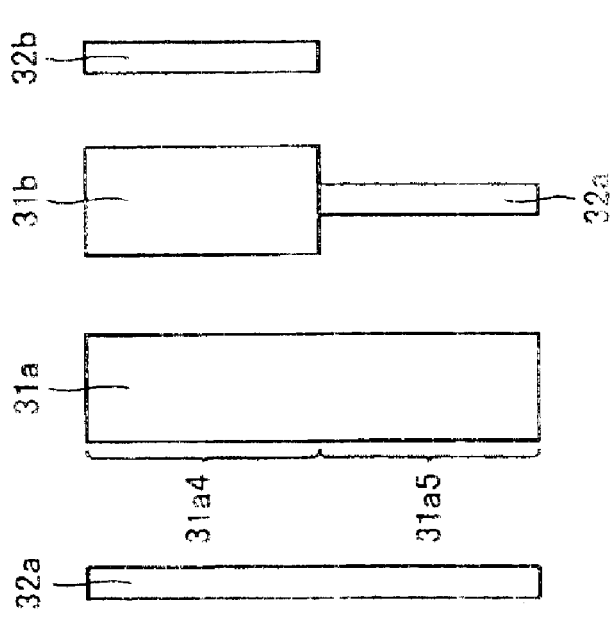
FIG. 5B is a top view of a semiconductor substrate showing the shape of a gate pattern formed by utilizing a photomask for pattern transfer according to FIG. 5A.
Figure 6:
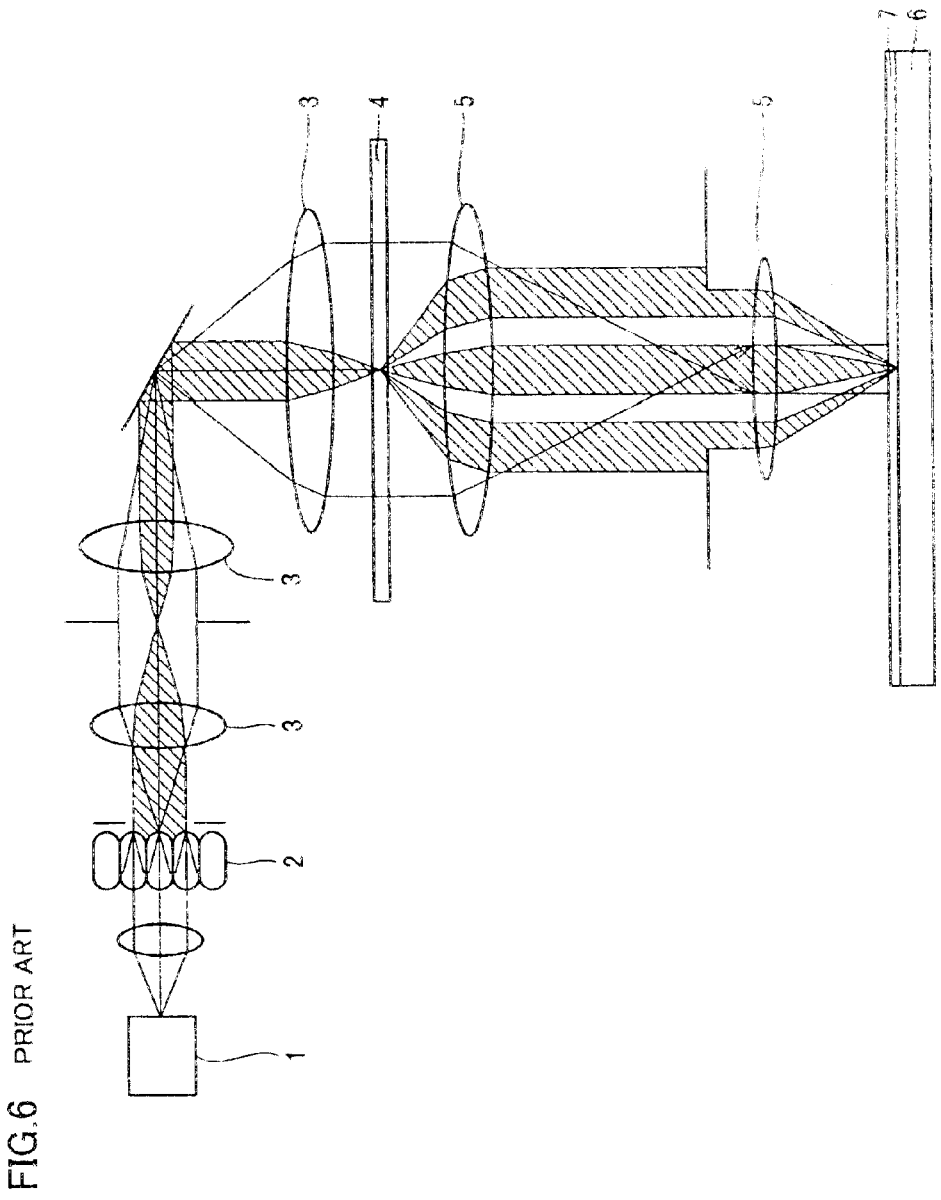
FIG. 6 is a conceptual diagram of a stepper utilized in a photolithographic process.
Figure 7:
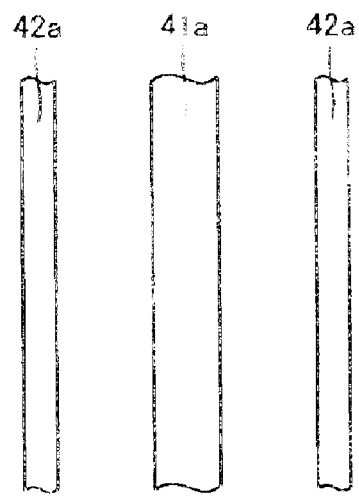
FIG. 7 is a pattern diagram showing auxiliary patterns positioned relative to an isolated main belt-shaped pattern.
Figure 8:
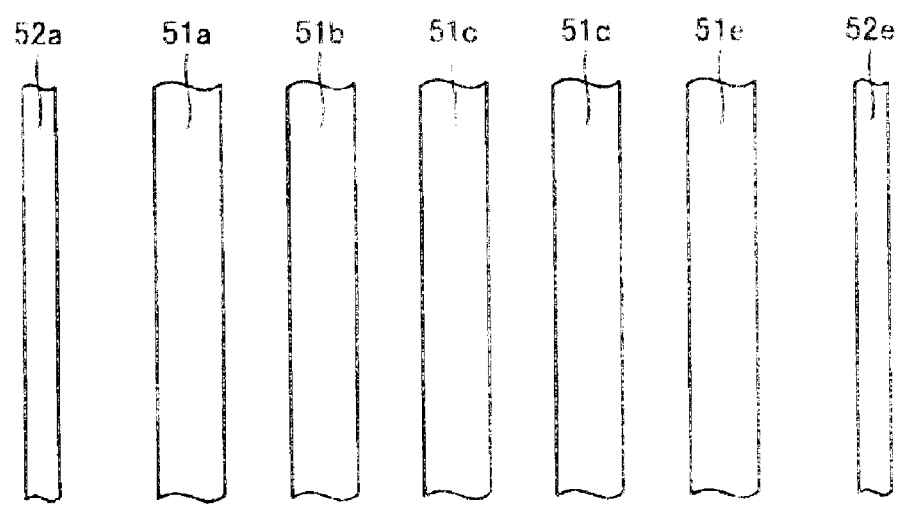
FIG. 8 is a pattern diagram showing main belt-shaped patterns having a fine pitch.

In the case that the patterns, positioned in a photomask for transferring a gate pattern to a photosensitive film deposited so as to cover a conductive layer that becomes gate electrodes, which are formed in the semiconductor substrate, have, as shown in FIG. 5A, a contact portion wherein an end side of auxiliary pattern 32a completely overlaps an end side of main pattern 31b, layout is carried out in advance (see FIG. 5B) so that the above described contact-portion is located at a position on the photomask corresponding to the position in the semiconductor substrate at a predetermined distance or greater away from a border 203 between active region 201 and element isolation region 202, toward the element isolation region 202 side. Thereby, as shown in FIG. 5B, even in the case that a protrusion 34 has generated in an edge portion of gate pattern 33b, there is no danger that gate pattern 33b and active region 201 will make contact with each other. Therefore, it becomes possible to prevent the characteristics of the semiconductor element from being negatively affected. Here, the predetermined distance is determined by the size of the protrusion based on the widths of the main patterns, the widths of auxiliary patterns, and the like, and indicates a distance having margin sufficient to prevent contact between the gate pattern and the active region, even in the case that a protrusion has generated.

It is as follows that a characteristic structure of a photomask for pattern transfer formed according to-this layout method is summarized. A photomask for pattern transfer is used in a process for forming gates of a semiconductor device having first and second belt-formed patterns for transferring gate patterns to a photosensitive film deposited so as to cover a conductive layer, that is to become gate electrodes formed in a semiconductor substrate, as well as auxiliary patterns positioned according to predetermined rules relative to the first and second belt-formed patterns, which do not substantially transfer an image. The first and second belt-formed patterns extend in the same direction. The first belt-formed pattern includes a parallel portion that extends in parallel to the adjacent second belt-formed pattern and a non-parallel portion for which there is no adjacent portion of a second belt-formed pattern. An end side forming an end of an auxiliary pattern positioned relative to the non-parallel portion of the first belt-formed pattern has a contact portion which completely overlaps an end side forming an end of the second belt-formed pattern so as to make contact. The above described contact portion is located at a position corresponding to the position in the semiconductor substrate at a predetermined distance, or greater, away from a border between an active region and an element isolation region, toward the element isolation region side.

In the above described embodiment, though the case is illustrated wherein auxiliary patterns are positioned based on the layout of main patterns wherein two main patterns extend parallel to each other, one of which is terminated partway, as a case wherein a microscopic point of contact or a microscopic step generates, the present invention is not, specifically, limited to this case. The present invention relates to, in the case that a main pattern for transferring an image and an auxiliary pattern that does not transfer an image make contact causing a microscopic point of contact or a microscopic step and in the case that auxiliary patterns that do not transfer an image make contact causing a microscopic point of contact or a microscopic step, a pattern layout method of a photomask for pattern transfer wherein the positions of such patterns are adjusted and the present invention is applicable to any layout as long as the layout satisfies the above described conditions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of pattern layout of a photomask for pattern transfer, used in a manufacturing process for a semiconductor device for transferring an image to a photosensitive film, the method comprising:

positioning patterns having belt shapes in a photomask layout for transferring an image to a photosensitive film;

temporarily positioning auxiliary patterns that do not substantially transfer an image to the photosensitive film in the photomask layout according to rules based on layout of the patterns having belt shapes;

selecting from the auxiliary patterns an auxiliary pattern having an end partially overlapping an end of one of the patterns having belt shapes and making contact with the pattern having the belt shape; and adjusting the position of the auxiliary pattern selected so that the end of the auxiliary pattern selected completely overlaps the end of the pattern having a belt shape and making the contact.

2. A method of pattern layout of a photomask for pattern transfer, used in a manufacturing process for a semiconductor device for transferring an image to a photosensitive film, the method comprising:

positioning patterns having belt shapes in a photomask layout for transferring an image to a photosensitive film:

temporarily positioning auxiliary patterns that do not substantially transfer an image to the photosensitive film in the photomask layout according to rules based on layout of the patterns having belt shapes;

selecting from the auxiliary patterns a first auxiliary pattern having an end partially overlapping an end of a second auxiliary pattern and making contact with the second auxiliary pattern; and adjusting position of the first auxiliary pattern so that the end of the second auxiliary pattern completely overlaps the end of the first auxiliary pattern.

3. The method of pattern layout according to claim 2, further comprising adjusting width of the first auxiliary pattern so that the width is the same as the width of the second auxiliary pattern.

* * * * *